United States Patent [19]

Huang et al.

[11] Patent Number: 5,682,055

[45] Date of Patent: Oct. 28, 1997

[54] METHOD OF FORMING PLANARIZED STRUCTURES IN AN INTEGRATED CIRCUIT

[75] Inventors: Kuei-wu Huang, Irving; Tsiu C. Chan; Gregory C. Smith, both of Carrollton, all of Tex.

[73] Assignee: SGS-Thomson Microelectronics, Inc., Carrollton, Tex.

[21] Appl. No.: 480,857

[22] Filed: Jun. 7, 1995

[51] Int. Cl.[6] .............................. H01L 29/94; H01L 29/04
[52] U.S. Cl. .......................... 257/408; 257/413; 257/51; 257/395; 257/752
[58] Field of Search .......................... 257/51, 344, 382, 257/385, 388, 395, 396, 408, 413, 752

[56] References Cited

U.S. PATENT DOCUMENTS

| | | | |
|---|---|---|---|
| 4,450,620 | 5/1984 | Fuls et al. | 257/413 |
| 4,775,644 | 10/1988 | Szeto | 257/396 |
| 4,807,013 | 2/1989 | Manocha | 257/900 |
| 4,841,347 | 6/1989 | Hsu | 257/413 |
| 4,859,620 | 8/1989 | Wei et al. | 437/44 |
| 4,868,138 | 9/1989 | Chan et al. | 437/44 |
| 4,937,643 | 6/1990 | Deslauriers et al. | 257/413 |
| 5,158,903 | 10/1992 | Hori et al. | 257/412 |
| 5,192,992 | 3/1993 | Kim et al. | 257/413 |
| 5,241,193 | 8/1993 | Pfiester et al. | 257/67 |
| 5,319,232 | 6/1994 | Pfiester | 257/67 |
| 5,341,016 | 8/1994 | Prall et al. | 257/412 |
| 5,365,081 | 11/1994 | Yamazaki et al. | 257/67 |

FOREIGN PATENT DOCUMENTS

60-103671  6/1985  Japan ....................... 257/51

OTHER PUBLICATIONS

Queirolo, et al., "Dopant Activation Carrier Mobility, and TEM Studies in Polycrystalline Silicon Films", *J. Electrochem. So.*, V. 137, No. 3, Mar., 1990, pp. 967–970.

C.S. Pai, et al., "Chemical IVapor Deposition of Selective Epitaxial Silicon Layers", *J. Electrochem. Soc.*, V. 137, No. 3, Mar., 1990, pp. 971–976.

*Primary Examiner*—Jerome Jackson
*Assistant Examiner*—John Gray
*Attorney, Agent, or Firm*—Theodore E. Galanthay; Kenneth C. Hill; Lisa K. Jorgenson

[57] ABSTRACT

A method is provided for forming an improved planar structure of a semiconductor integrated circuit, and an integrated circuit formed according to the same. A field oxide is grown across the integrated circuit patterned and etched to form an opening with substantially vertical sidewalls exposing a portion of an upper surface of a substrate underlying the field oxide where an active area will be formed. A gate electrode comprising a polysilicon gate electrode and a gate oxide are formed over the exposed portion of the substrate. The polysilicon gate has a height at its upper surface above the substrate at or above the height of the upper surface of the field oxide. The gate electrode preferably also comprises a silicide above the polysilicon and an oxide capping layer above the silicide. LDD regions are formed in the substrate adjacent the gate electrode and sidewall spacers are formed along the sides of the gate electrode including the silicide and the capping layer.

14 Claims, 4 Drawing Sheets

5,682,055

METHOD OF FORMING PLANARIZED STRUCTURES IN AN INTEGRATED CIRCUIT

This application is related to co-pending application Ser. No. 08/486,347, filed on the same day herewith, Jun. 7, 1995, both assigned t SGS-Thomson Microelectronics, Inc. and incorporated herein by reference.

1. FIELD OF THE INVENTION

The present invention relates generally to semiconductor integrated circuit processing, and more specifically to an improved method of forming more planarized structures in an integrated circuit.

2. BACKGROUND OF THE INVENTION

As is well known in the field of integrated circuit design, layout and fabrication, the manufacturing cost of a given integrated circuit is largely dependent upon the chip area required to implement desired functions. The chip area, in turn, is defined by the geometries and sizes of the active components such as gate electrodes in metal-oxide-semiconductor (MOS) technology, and diffused regions such as MOS source and drain regions and bipolar emitters and base regions.

Device structures are constantly being proposed with the objective of producing higher response speeds, higher device yields and reliability, lower power consumption and higher power handling capability. Many of the device improvements are achieved by scaling down or miniaturizing the devices. One approach is to simply scale down all process variables, dimensions and voltages. This approach includes, among other factors, for example for the typical MOS device, scaling dielectric thicknesses, channel lengths add widths, junction widths and doping levels. With this approach, the number of devices per unit area increases, threshold voltages decrease, delay time across channels decreases and power dissipated per area decreases. All device parameters, however, do not need to be scaled by the same constant. A design or process engineer may scale some device parameters independently of others which would optimize device operation. This more flexible approach would allow for a choice in geometries to fit with various tradeoffs for device optimization, rather than choosing a more strict scaling approach.

In addition to the geometries and sizes of active components and the ability to scale process variables, the chip area also depends on the isolation technology used. Sufficient electrical isolation must be provided between active circuit elements so that leakage current and low field device threshold voltages do not cause functional or specification failures. Increasingly more stringent specifications, together with the demand, for example, for smaller memory cells in denser memory arrays, places significant pressure on the isolation technology in memory devices, as well as in other modern integrated circuits.

A well-known and widely-used isolation technique is the local oxidation of silicon, commonly referred to as LOCOS, to form a field oxide region separating various active areas of an integrated circuit. The LOCOS process was a great technological improvement in reducing the area needed for the isolation regions and decreasing some parasitic capacitances. This technique involves forming a silicon nitride over a deposited polysilicon, patterning the nitride and polysilicon, and then etching away the regions uncovered by the pattern. The exposed regions are then oxidized to form the field oxide. This process though is subject to certain well-known limitations, such as the lateral encroachment of the oxide into the active areas, known as "birdbeaking" wherein the oxygen diffuses laterally under the polysilicon/nitride mask and in the silicon. The birds' beak increases the isolation area thereby decreasing the available active area for devices. Other limitations include additional topography added to the integrated circuit surface and undesired nitride spots forming along the interface of the silicon substrate and silicon oxide regions, known as the "Kooi" effect. Thermally grown gate oxides formed subsequent to the formation of the field oxide are impeded in the region of these nitride spots. Typically, these nitride spots are removed before gate oxides are formed, as with the well-known sacrificial oxide process as described more fully in U.S. Pat. No. 4,553,314 issued on Nov. 19, 1985 to Chan et al. However, the process of removing the nitride spots increases complexity and thus additional manufacturing costs as well as adding additional topography to the wafer causing step coverage problems at later stages.

Another well-known isolation technique is to form a standard field oxide by depositing silicon dioxide on the surface of the substrate, patterning and etching the field oxide to expose the active regions, leaving the oxide in the desired isolation regions. There is a known limitation with this approach, also. The etch step produces steep sidewalls causing step coverage problems for subsequently formed layers. Steps have been proposed to taper or round the steep sidewalls of the field oxide, but these may not be reproducible. In active regions where gate electrodes are to be formed from a first layer of polysilicon, the conformal nature of polysilicon causes undesired polysilicon sticks that when etched to expose the silicon substrate between the isolation regions forms along the steep field oxide sidewalls. These sticks are strips of polysilicon which remain after etching adjacent the field oxide at the substrate surface due to the height of the sidewalls and the conformality of polysilicon as deposited. In addition, undesired increases in the width of the etched regions may result, reducing the number of active areas on the die, thereby reducing the number of devices that can be formed. The semiconductor industry has been striving for ever smaller feature sizes for denser structures for manufacturing. A corollary to this goal is to achieve planar structures. It would therefore be desirable to have a planarized surface which utilizes standard processing steps to yield denser structures.

It is therefore an object of the present invention to provide a method of forming planarized structures for scaling semiconductor devices.

It is a further object of the present invention to provide a method of forming improved transistors while increasing the planarity of the surface of the wafer thereby minimizing subsequent step coverage problems.

It is a further object of the present invention to provide a standard field oxide to improve the scaling and planarity of the devices.

It is a further object of the present invention to provide a method of forming the devices adjacent to isolation regions which requires significantly fewer subsequent processing steps thereby decreasing the manufacturing complexity and producing higher yields and reliability.

It is yet a further object of the present invention to provide a method which reduces the formation of the polysilicon sticks.

Other objects and advantages of the present invention will be apparent to those of ordinary skill in the art having reference to the following specification together with the drawings.

SUMMARY OF THE INVENTION

The invention may be incorporated into a method for forming a semiconductor device structure, and the semiconductor device structure formed thereby. A field oxide is grown across the integrated circuit, patterned and etched to form an opening with substantially vertical sidewalls exposing a portion of an upper surface of a substrate underlying the field oxide where an active area will allow for devices to be formed. A gate oxide is grown over the exposed portion of the substrate. A polysilicon layer is deposited over the field oxide and gate oxide to a thickness wherein the lowest most portion of the upper surface of the polysilicon is above the upper surface of the field oxide. The polysilicon layer is planarized and etched. Preferably, a silicide layer is formed over the polysilicon layer and a dielectric capping layer is formed over the silicide layer. A photoresist mask is formed over a portion of the capping layer overlying at least a portion of the substrate not covered by the field oxide. The capping layer, silicide, polysilicon layer and gate oxide are etched to form a transistor gate electrode. The photoresist is removed and LDD regions are formed in the substrate adjacent the gate electrode. Sidewall spacers are formed along the sides of the gate electrode. In a preferred embodiment, raised source/drain regions are formed adjacent the sidewall spacers to increase the planarity of the device.

BRIEF DESCRIPTION OF THE DRAWINGS

The novel features believed characteristic of the invention are set forth in the appended claims. Referring now to FIGS. 1A–6B, a method of fabricating a planarized circuit according to the present invention will now be described in detail. The invention itself, however, as well as a preferred mode of use, and further objects and advantages thereof, will best be understood by reference to the following detailed description of illustrative embodiments when read in conjunction with the accompanying drawings, wherein:

FIGS. 1A–1C, 2B–5B are cross-sectional views of the fabrication of a semiconductor integrated circuit according to one embodiment of the present invention.

FIGS. 6A–6B are cross-sectional views of the fabrication of a semiconductor integrated circuit according to another alternative embodiment of the present invention.

DETAILED DESCRIPTION OF THE PREFERRED EMBODIMENTS

Referring now to FIGS. 1A–6B, a method of fabricating a planarized integrated circuit according to the present invention will now be described in detail. The cross-sections of these Figures illustrate this method as a portion of an overall process flow for fabricating the integrated circuit. As will be apparent to those of ordinary skill in the art, the partial process flow to be described herein may be applied in the fabrication of many types of integrated circuits, in which the full process flow will include many other process steps conventional in the art.

Figure 1A:
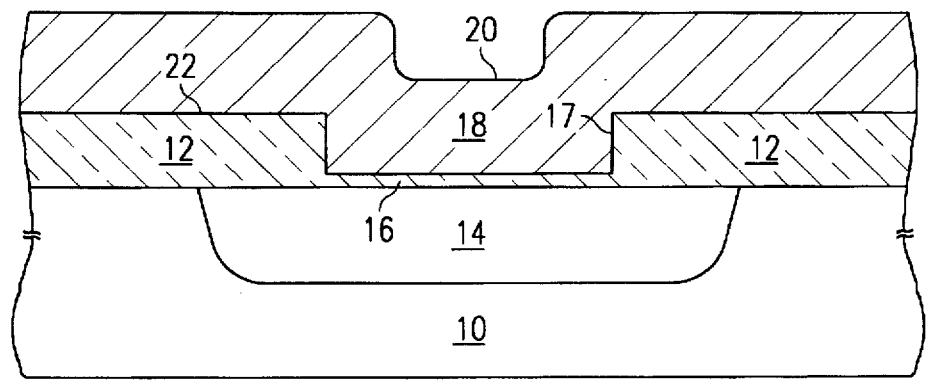
Figure 1B:
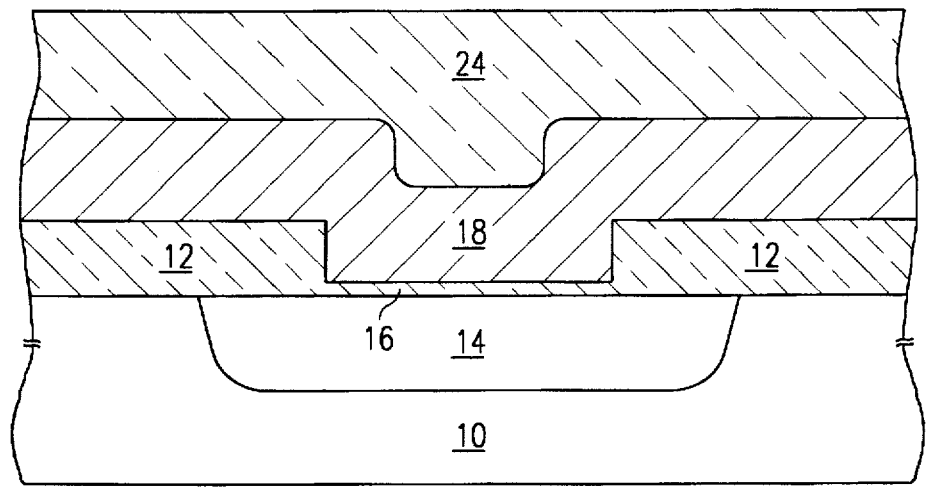

Referring now to FIG. 1A illustrating a portion of a wafer, in cross-section, which has been partially fabricated. According to the example described herein, the present invention is directed to forming a CMOS planarized structure. It is contemplated, of course, that the present invention will also be applicable to the formation of other structures where planarization is important.

FIG. 1A illustrates a portion of a wafer which has a surface at which isolation structures and devices in adjacent active areas are to be formed. As shown in FIG. 1A, an integrated circuit is to be formed on a silicon substrate 10. The silicon substrate may be p- or n-doped silicon depending upon the location in the wafer where the isolation and active devices are to be formed. A field oxide layer is thermally grown across the integrated circuit preferably to a depth of between approximately 4000 to 5000 angstroms, then patterned and etched to form field oxide regions 12. Field oxide regions 12 are formed on various portions of the wafer to isolate the active areas where devices will be formed. The field oxide regions are preferably etched anisotropically to achieve vertical sidewalls in the openings 17. Prior to the formation of the field oxide regions, depending upon the location of the substrate where the openings will be subsequently made through the field oxide regions, a well implant may be made. For example, if the substrate is p-type below the field oxide and an n-well is desired for the active area, an n-well 14 can be formed by implantation and drive-in of phosphorous at a dosage of approximately $5 \times 10^{12}/cm^2$ at 150 KeV or other suitable means and dopant type to achieve the desired doping profile.

After various conventional processing steps have been performed if necessary to repair any damage caused to the substrate surface, such as a strip or healing oxide thermally grown formed and etched away, a gate oxide layer 16 is formed, typically by thermal oxidation over the silicon substrate 10 to a depth of approximately 70 to 100 angstroms. In addition to the implant performed to form the n-well described above, prior to the formation of the gate oxide, a blanket implant may be done to adjust the doping levels of the various portions of the integrated circuit not covered by the field oxide regions. For example, the blanket implant may comprise boron implanted at a dosage of approximately $1.5 \times 10^{12}/cm^2$ at 30 KeV. Additional implants may be performed into the n-wells by masking off the p-type regions to adjust for the appropriate threshold voltages. An implant, for example, may be boron implanted at a dosage of approximately $1.7 \times 10^{12}/cm^2$ at a relatively low energy level of 30 KeV. A further punch-through implant may be made into the n-well regions by implanting, for example, boron at a dosage of approximately $1 \times 10^{12}/cm^2$ at a higher energy level of 75 KeV. Additional implants can also be made into the p-type regions by masking off the n-wells to further adjust the doping levels, for example, by implanting boron at a dosage of approximately $6 \times 10^{12}/cm^2$ and at 180 KeV.

A polysilicon layer 18 is formed over the gate oxide layer 16. The polysilicon is generally conformal which will cause it to follow the contour of the surface of the wafer as it is deposited. The polysilicon is therefore, in the present invention, preferably deposited to a depth wherein the lowest most portion of the upper surface 20 of the polysilicon layer 18 lies above the upper surface 22 of the field oxide regions. The polysilicon layer 18 is deposited to a depth of between approximately 7000 to 9000 angstroms. With the field oxide at 4000–5000 angstroms, the polysilicon will tend to be more planar when its overall thickness is greater than the underlying layer. The polysilicon layer 18 may be in-situ doped or doped after deposition to a desired doping level.

Figure 1C:
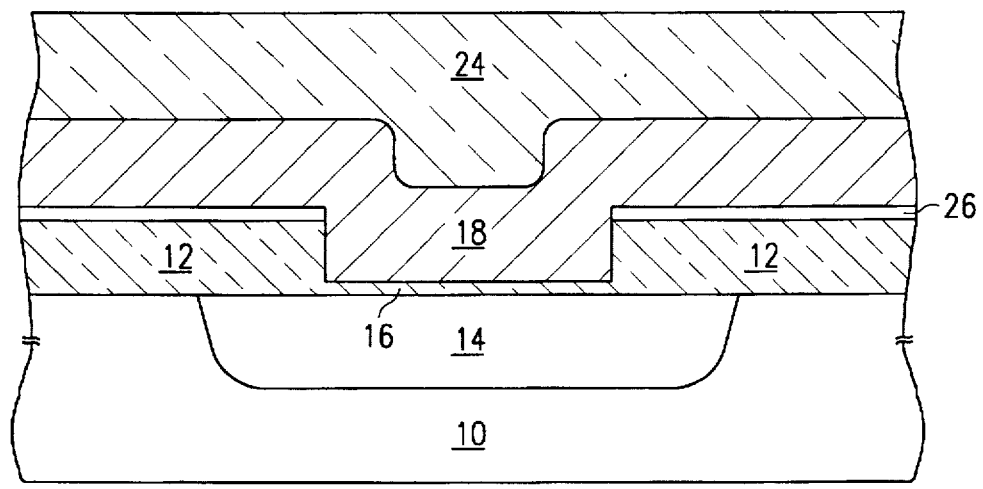
Figure 2A:
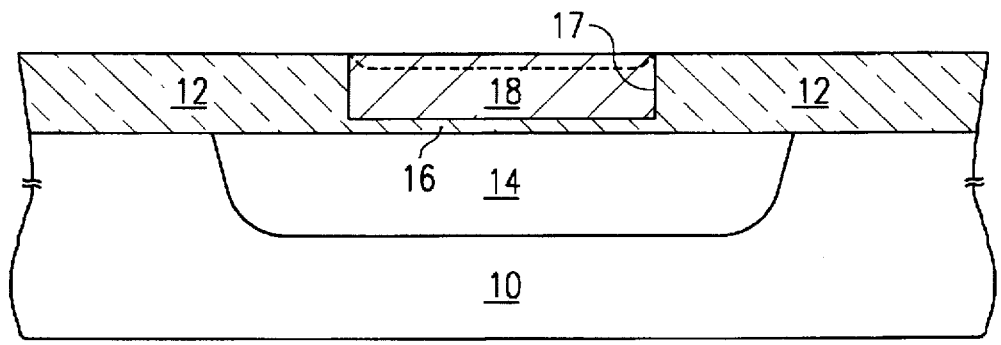
FIG. 2A is a cross-sectional view of the fabrication of a semiconductor integrated circuit according to an alternative embodiment of the present invention.
Figure 2B:
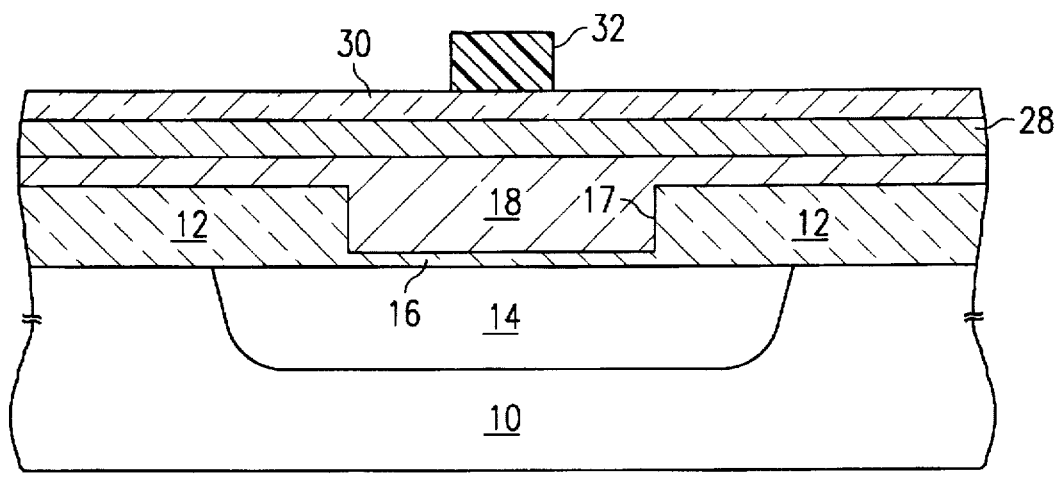

Polysilicon layer 18 is next planarized and then etched to form the gates of various devices. One advantage of forming the polysilicon in this manner is the ability to minimize the formation of polysilicon sticks or strips of polysilicon which remain in the bottom edges of contacts, vias or low lying areas as a result of etching a very conformal polysilicon layer that dips below the surface of the material covered. One embodiment illustrating the planarization of the polysilicon layer 18 is shown with reference to FIG. 1B. A non-conformal layer 24 is formed over the polysilicon layer 18 to a level which tends to form a planar upper surface. The layer 24 may be any suitable planarizing material, for example, spin-on-glass or a sacrificial photoresist, which preferably has an etch ratio of 1:1 with the polysilicon. Having an etch ratio of 1:1 will enable an etch step to uniformly etch the planarizing and polysilicon layers at the same rate. Alternatively, an etch stop layer 26, as shown in FIG. 1C, may be formed under the polysilicon over the field oxide regions. The etch stop layer may again be any suitable material such as nitride or a refractory metal. The planar layer 24 and polysilicon layer 18 are then etched before subsequent processing steps occur. The etch may comprise a wet etch or a combination wet/dry etch or a chemical mechanical polishing (CMP). FIG. 2A illustrates that the polysilicon layer 18 may be etched to the top of opening 17 exposing the upper surface of the field oxide regions. If a wet etch is used, the polysilicon may dip below the upper surface of the field oxide regions as indicated by the dotted line in FIG. 2A. Alternatively, the polysilicon layer 18 may remain uniformly across the top of the field oxide regions 12 and the opening 17, to a depth of between approximately 1500 to 2000 angstroms, as shown in FIG. 2B. An alternative method of planarization is to etch by chemical mechanical polishing (CMP) with or without the planar dielectric formed across the polysilicon.

Referring to FIG. 2B, a silicide layer 28 may be formed over the polysilicon layer 18, preferably from the group consisting of tantalum, tungsten, titanium and molybdenum to a thickness of between approximately 1200 to 1700 angstroms. If the polysilicon layer 18 is etched exposing the upper surface of the field oxide regions 12, the silicide would be formed over the polysilicon in the opening 17 and over the field oxide regions 12. The silicide will insure sufficient conductivity of the polysilicon, particularly where the polysilicon forms an interconnect over field oxide regions. A capping layer 30 may be formed over the silicide layer 28. The capping layer is preferably formed of an oxide, nitride or oxynitride, having a thickness of between approximately 1200 to 1700 angstroms. A photoresist layer is formed over capping layer 30 and patterned to form the photoresist region 32 which overlies the substrate in opening 17.

Figure 3:
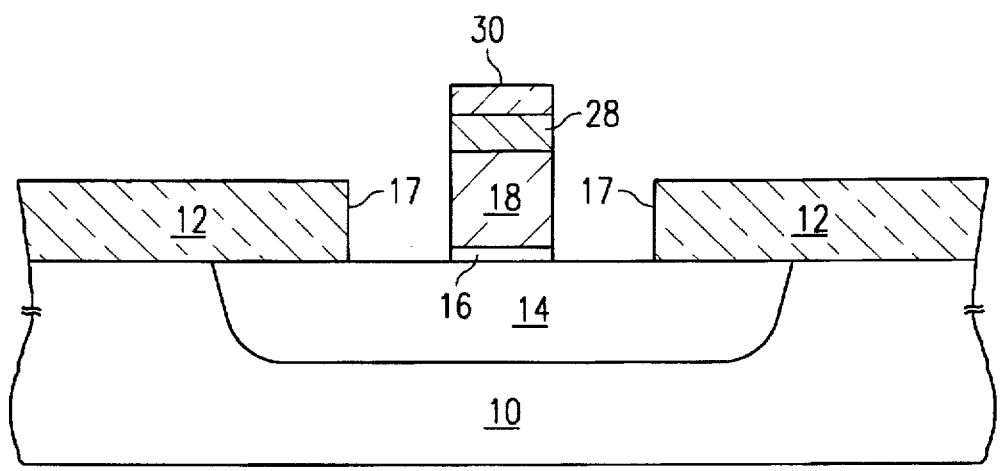

Referring to FIG. 3, the gate oxide 16, polysilicon layer 18, silicide layer 28 and capping layer 30 are etched to form a transistor gate. The height of the polysilicon layer 18 above the substrate surface will depend on whether the polysilicon was etched exposing the upper surface of the field oxide regions or whether it remained over the field oxide before it was etched to form the transistor gate. Therefore, the overall height of the transistor gate will be above the upper surface of the field oxide regions 12 due to the combined height of the multiple layers forming the transistor gate.

Figure 4:
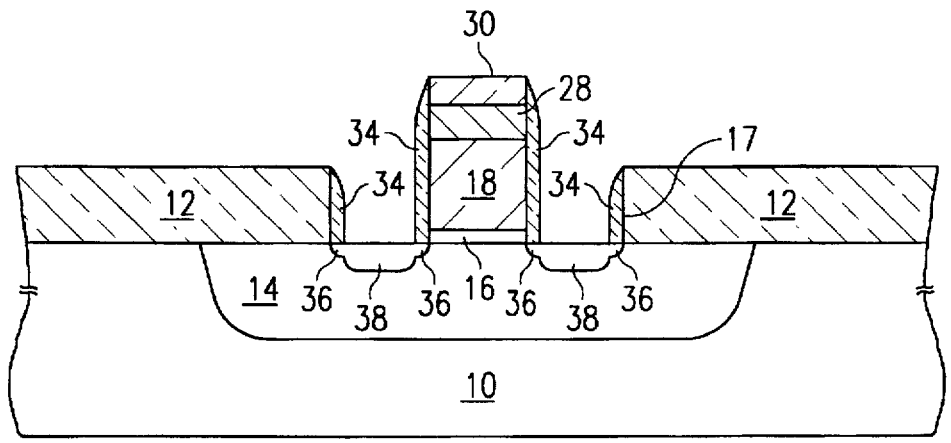

Referring to FIG. 4, lightly doped drain regions 36 are formed in the substrate adjacent the transistor gate by known methods, for example, implanting phosphorous at a dosage of approximately $3 \times 10^{13}$ at 80 KeV for the n-channel transistor and boron at a dosage of $3 \times 10^{13}$ at 50 KeV for the p-channel transistor. Sidewall oxide spacers 34 are then formed by known methods along the sides of the transistor gate including the silicide 28 and the capping layer 30, if formed. In addition, a sidewall spacer will form along the vertical sides of the field oxide regions 12. The sidewall spacers are typically formed of oxide or nitride and will form on both the gate and the field oxide which will narrow the opening 17 making it important to form adequate source/drain regions as well as contacts to the source/drain regions despite the high aspect ratio of the opening 17. More heavily doped source/drain regions 38 are then formed in the substrate adjacent the sidewall spacers.

The typical process in the prior art of forming transistor gates and LOCOS field oxide regions has been simplified by forming standard field oxide regions and a transistor gate with little or no polysilicon sticks. Once the transistor gate has been formed with the standard field, it is important to minimize the impact of the aspect ratio as it relates to the filling of the contact opening 17 to contact the source/drain regions 38. The preferred embodiment which provides for a more planar transistor is to form raised source/drain regions in the opening 17 adjacent the transistor gate which will adequately fill the opening.

Figure 5A:
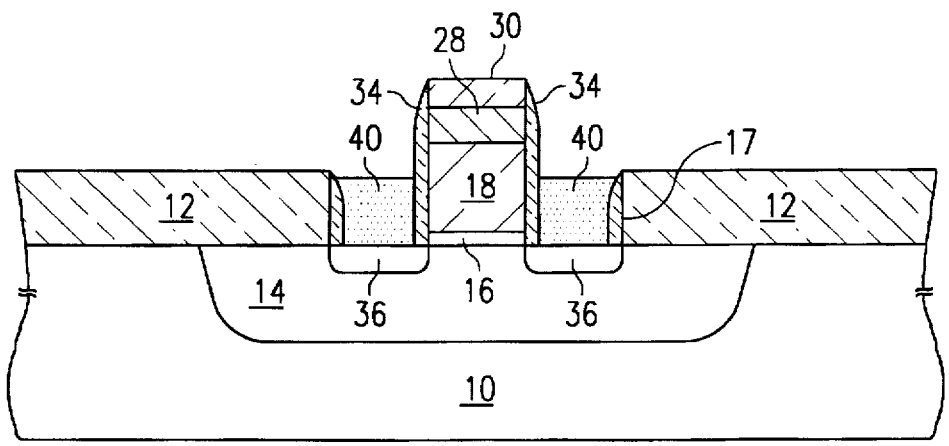

Referring to FIG. 5A, one embodiment of forming the raised source/drain regions is illustrated. Epitaxial regions 40 are selectively grown above the exposed substrate surface and implanted with an appropriate dopant to achieve a desired conductivity level. The epitaxial regions 40 may, for example, be doped by implanting phosphorous at a dosage of approximately $6 \times 10^{15}$ and at 40 KeV for the n-channel transistor and $BF_2$ at a dosage of $6 \times 10^{15}$ and at 40 KeV. Typically, the epitaxy grows vertically from the substrate surface, therefore, the epitaxial regions 40 may not show as much faceting at the sides or corners of the epitaxy as may be seen adjacent a standard LOCOS process since the sidewalls of the standard field oxide regions are substantially vertical.

Figure 5B:
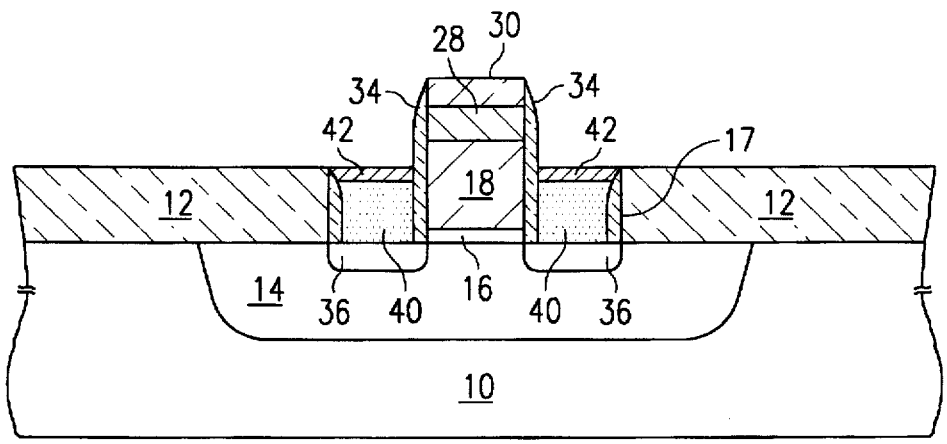

Referring to FIG. 5B, the epitaxy is preferably silicided by known methods, for example, by depositing a refractory metal over the integrated circuit followed by a thermal step to react the refractory metal with the silicon in the epitaxial regions to form a silicide 42. The silicide regions 42 will lower the resistivity of the raised source/drain regions 40, while the raised source/drain regions 40 will prevent any undesired amount of the substrate silicon from being consumed, thereby reducing the possibility of junction leakage and punchthrough. Depending upon the depth of the LDD regions and the weight of the epitaxial regions 40, there may not be a need for the more heavily doped source/drain regions 38. The sidewall spacers 34 and capping layer 30 will help to electrically isolate the raised source/drain regions 40 from the gate electrode 18 of the transistor. Although the capping layer is not necessary at this stage, the electrical isolation is improved with the capping layer in place, particularly when the sidewall spacer begins at the capping layer. The raised source/drain regions 40 will provide for more thermal stability for subsequent high temperature processing steps as compared to a conventional salicide process which forms a silicide over the substrate source/drain regions and over the gate electrode.

Figure 6A:
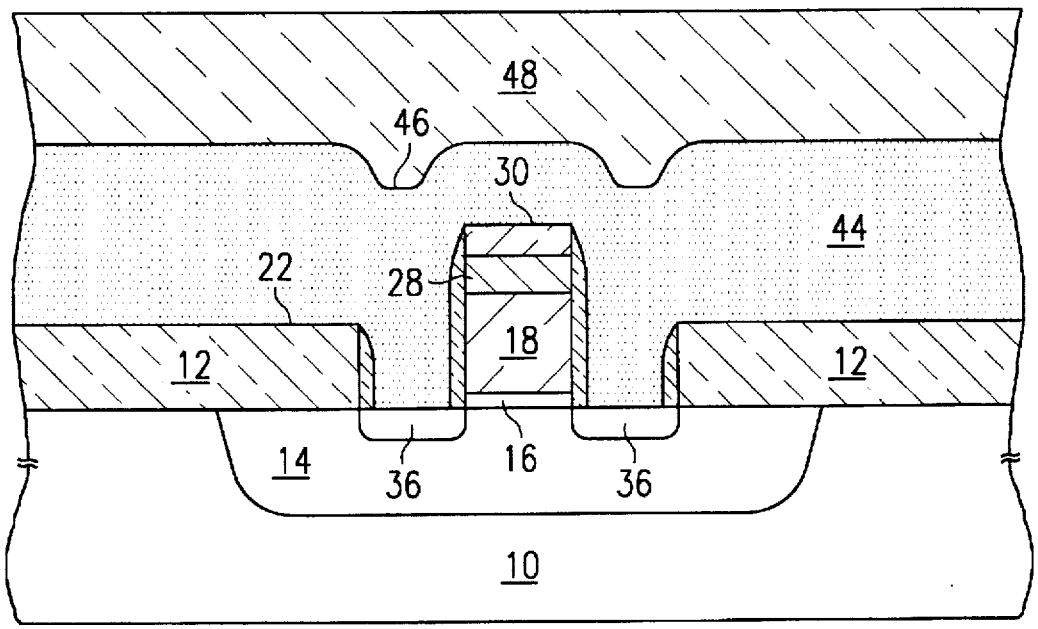

Referring to FIG. 6A, an alternative embodiment for forming the raised source/drain regions is illustrated. A polysilicon layer 44 is deposited over the transistor gate, exposed substrate and the field oxide regions. As described with the deposition of the first polysilicon layer 18 above, the polysilicon layer 44 will be conformally deposited. It is preferably doped after it is deposited to a desired doping level to allow for separate doping of n- and p-type regions. Because of its conformality, in order to fill the opening 17 to form the raised source/drain regions, the polysilicon layer 44 is deposited to a thickness wherein the lowermost portion 46 of the polysilicon layer 44 is above the upper surface 22 of the field oxide regions 12 and preferably above the upper surface of the capping layer 30. A planar sacrificial layer 48, for example spin-on-glass or photoresist having an etch rate of 1:1 with the polysilicon layer 44 may be formed over the polysilicon layer 44.

Figure 6B:
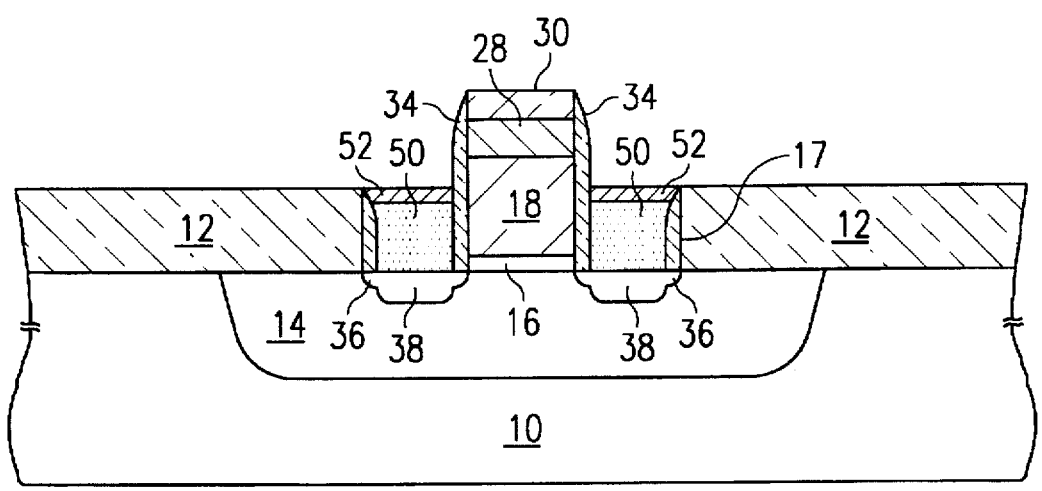

Referring to FIG. 6B, an etch of the sacrificial layer 48 and the polysilicon layer 44 is performed to expose an upper surface of the field oxide regions 12 forming the raised source/drain regions 50 in opening 17. It is important to note that for a polysilicon raised source/drain, the etch chemistry used must be selective to the polysilicon so that the underlying layers are not etched. The etch may be a wet etch, dry etch, CMP or conbination of these three, which are selective to the sacrificial layer 48 and polysilicon layer 44, etching the sacrificial layer and the polysilicon layer at the same rate but which does not substantially etch the sidewall spacers 34, the capping layer 30 or the silicide layer 28, if the capping layer is not formed, and the field oxide regions 12, including any etch stop layer formed. The polysilicon raised source/drain regions 50 may also be silicided as described above for both the transistor gate and the epitaxial raised source/drain regions. The silicide regions 52 of the polysilicon raised source/drain regions 50 will also lower the resistivity of the raised source/drain regions, while the raised source/drain regions 50 help to prevent any undesired amount of the substrate silicon from being consumed, again reducing the possibility of junction leakage and punch-through. The sidewall spacers 34 and capping layer 30 will help to electrically isolate the raised source/drain regions 50 from the gate electrode 18 of the transistor. In addition, the capping layer 30, if formed, may be removed before the raised source/drain regions are silicided, thereby allowing the polysilicon gate electrode 28 to be silicided at the same time as the raised source/drain regions simplifying the process further. This method may allow for easier manufacturing of devices that have only one polysilicon layer, for example microprocessors, instead of multiple polysilicon layers, such as in SRAMs.

As with the grown epitaxial regions described above, the raised source/drain regions provide for more thermal stability for subsequent high temperature processing steps as compared to a conventional salicide process. As with the grown epitaxy, this alternative embodiment will provide for a more planar device for subsequent processing steps while simplifying the formation of the field oxide regions and transistor gate. With each embodiment described, there needs to be a minimum thickness of the capping layer and sidewall oxide spacers to maintain adequate distance between any conductive material formed in the opening and the transistor gate electrode. This distance will insure the necessary electrical isolation of the devices and maintain device integrity.

While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A structure consisting of a portion of a semiconductor integrated circuit, comprising:

a field oxide formed across the integrated circuit having an opening therethrough with substantially vertical sidewalls exposing a portion of an upper surface of a substrate underlying the field oxide;

a gate oxide over a portion of the exposed portion of the substrate;

a polysilicon gate electrode overlying the gate oxide and having an upper surface planar with or above an upper surface of the field oxide, wherein the polysilicon gate electrode has a thickness of between approximately 7000–9000 angstroms;

LDD regions in the substrate adjacent the gate electrode; and sidewall spacers along the side of the polysilicon gate electrode.

2. The structure of claim 1, wherein the field oxide has a thickness of between approximately 4000–5000 angstroms.

3. The structure of claim 1, wherein the gate oxide has a thickness of between approximately 70–100 angstroms.

4. The structure of claim 1, further comprising:

a silicide layer over the polysilicon gate electrode.

5. The structure of claim 4, wherein the silicide is from the group consisting of tantalum, tungsten, titanium and molybdenum.

6. The structure of claim 4, wherein the silicide has a thickness of between approximately 1200–1700 angstroms.

7. The structure of claim 4 further comprising:

a capping layer over the silicide.

8. The structure of claim 7, wherein the capping layer comprises oxide.

9. The structure of claim 7, wherein the capping layer has a thickness of between approximately 1200–1700 angstroms.

10. The structure of claim 1, further comprising:

source/drain regions adjacent the gate electrode in the substrate.

11. The structure of claim 1, further comprising:

raised source/drain regions adjacent the gate electrode and overlying the exposed substrate.

12. The structure of claim 11, wherein the raised source/drain regions comprise:

doped polysilicon; and silicide over the upper surface of the doped polysilicon.

13. The structure of claim 11, wherein the raised source/drain regions comprise:

doped selectively grown epitaxy; and silicide over an upper portion of the selectively grown epitaxy.

14. The structure of claim 1, further comprising:

an n-well in the active area in the substrate.

* * * * *